United States Patent [19]

Reinfelder et al.

[11] Patent Number: 5,084,675
[45] Date of Patent: Jan. 28, 1992

[54] METHOD FOR IMPROVING THE SIGNAL-TO-NOISE RATIO IN A NUCLEAR MAGNETIC RESONANCE TOMOGRAPHY APPARATUS

[75] Inventors: Hans-Erich Reinfelder, Erlangen; Hubertus Fischer, Bamberg, both of Fed. Rep. of Germany

[73] Assignee: Siemens Aktiengesellschaft, Munich, Fed. Rep. of Germany

[21] Appl. No.: 565,951

[22] Filed: Aug. 10, 1990

[30] Foreign Application Priority Data

Aug. 11, 1989 [EP] European Pat. Off. ........ 89114922.1

[51] Int. Cl.⁵ .............................................. G01R 33/20
[52] U.S. Cl. ..................................... 324/309; 324/307
[58] Field of Search .............. 324/300, 307, 309, 310, 324/311, 312, 313, 314, 318, 322; 128/653 A, 653 SC, 653 AF

[56] References Cited

U.S. PATENT DOCUMENTS

| 4,825,161 | 4/1989 | Barnea et al. | 324/309 |
|---|---|---|---|
| 4,881,033 | 11/1989 | Denison et al. | 324/309 |
| 4,896,113 | 1/1990 | Pelc | 324/309 |
| 4,973,111 | 11/1990 | Haacke et al. | 324/309 |
| 5,022,398 | 6/1991 | Dumoulin | 128/653 AF |
| 5,038,784 | 8/1991 | Dumoulin | 128/653 AF |

FOREIGN PATENT DOCUMENTS

| 0021535 | 1/1981 | European Pat. Off. |
| 0076054 | 4/1983 | European Pat. Off. |
| 0132337 | 1/1987 | European Pat. Off. |
| 3114421 | 10/1982 | Fed. Rep. of Germany |

OTHER PUBLICATIONS

"Nuclear Magnetic Resonance Microscopy with 4-μm Resolution: Theoretical Study and Experimental Results," Cho et al., Med. Phys. vol. 15(6), Nov./Dec. 1988, pp. 815-824.

"The Use of Band-Selectable Digital Filtering in Magnetic Resonance Image Enhancement," Mitchell et al., Mag. Res. in Med. vol. 9, (1989) pp. 353-368.

Primary Examiner—Michael J. Tokar
Attorney, Agent, or Firm—Hill, Van Santen Steadman & Simpson

[57] ABSTRACT

In the echo planar imaging (EPI) method of operating a nuclear magnetic resonance (magnetic resonance imaging) tomography apparatus, the necessary, rapid switching of gradients having a high amplitude usually cannot be achieved with square-wave gradients, and therefore a read-out gradient having a sinusoidal shape is generally used. Given a chronologically equidistant sampling of the nuclear magnetic resonance signal in the time domain, however, a sampling in the k-space with different rates is present. The bandwidth of the signal is proportional to the sampling rate in the k-space. In the method disclosed herein, bandwidth of a bandpass filter or a low-pass filter in the signal processing circuit for the nuclear magnetic resonance signal is adapted to the time dependent bandwith of the nuclear magnetic resonance signal, i.e., to the sampling rate in the k-space. The bandwidth is increased with increasing sampling rate. The signal-to-noise ratio is noticeably improved.

8 Claims, 4 Drawing Sheets

METHOD FOR IMPROVING THE SIGNAL-TO-NOISE RATIO IN A NUCLEAR MAGNETIC RESONANCE TOMOGRAPHY APPARATUS

BACKGROUND OF THE INVENTION

1. Field of the Invention

The present invention is directed to a method for improving the signal-to-noise ratio in the operation of a nuclear magnetic resonance tomography apparatus, also known as a magnetic resonance imaging tomography apparatus, using the known echo planar imaging (EPI) method.

2. Description of the Prior Art

A method for operating a nuclear magnetic resonance tomography apparatus known as the echo planar imaging (EPI) method is disclosed in European application 0 076 054, corresponding to U.S. Pat. No. 4,509,015. In summary, the echo planar imaging method includes the generation of an RF excitation pulse which is made slice-selective by simultaneously generating a magnetic field gradient in a first direction. A phase coding gradient is generated in a second direction, and a read-out gradient consisting of a gradient pulse sequence changing in polarity from pulse-to-pulse is generated in a third direction. The nuclear magnetic resonance signal acquired under the read-out gradient is phase demodulated, and is conducted through a bandpass filter. The output of the filter is digitized at a sampling rate and for each gradient pulse, is written into a row of a raw data matrix in the k-space. An image matrix is derived from the raw data matrix by two-dimensional Fourier transformation, and an image is produced from the image matrix.

Further details of the echo planar imaging method are discussed below in connection with FIGS. 1-9 to assist in the explanation of a problem associated with that known method to which the improvement disclosed herein is directed.

The basic components of a conventional nuclear magnetic resonance tomography apparatus are shown in FIG. 1. Coils 1-4 generate a static, fundamental magnetic field in which, if the apparatus is used for medical diagnostics, the body of a patient 5 to be examined is situated. Gradient coils are provided for generating independent orthogonal magnetic field components in the x, y and z directions, according to the coordinate system 6. For clarity, only gradient coils 7 and 8 are shown in FIG. 1, which generate the x-gradient in combination with a pair of identical gradient coils disposed on the opposite side of the patient 5. Sets of y-gradient coils (not shown) are disposed parallel to the body 5 above and below the body 5, and sets of z-gradient coils (not shown) are disposed at the head and feet of the body 5 extending transversely relative to the longitudinal axis of the body 5.

The apparatus also includes an RF coil 9 which excites selected nuclei in the body 5 so that nuclear magnetic resonance signals are generated, and also serves to acquire the resulting nuclear magnetic resonance signals.

The coils 1, 2, 3, 4, 7, 8 and 9 bounded by a dot-dash line 9 represent the actual examination instrument. The instrument is operated by an electrical arrangement which includes a fundamental field coils supply 11 for operating the coils 1-4 and a gradient fields coils supply 12 for operating the gradient coils 7 and 8 and the further gradient coils.

Via a switch 19, the RF coil 9 can be connected to an RF transmitter 15, in an excitation mode, or to an amplifier 14 in a signal reception mode. The amplifier 14 and the transmitter 15 are a part of an RF unit 16, which is connected to a process control computer 17. The computer 17 is also connected to the gradient fields coils supply 12. The computer 17 constructs an image from the nuclear magnetic resonance signals, which is portrayed on a display 18.

A number of pulse sequences are known for operating the RF unit 16 and the gradient coils. Methods have prevailed wherein the image generation is based on a two-dimensional or a three-dimensional Fourier transformation. One such method is the aforementioned echo planar imaging method.

A pulse sequence used in the echo planar imaging method is shown in FIGS. 2-6. A radio-frequency excitation pulse RF, shown in FIG. 2, is generated which excites nuclei in a slice of the examination subject which is selected by a slice-selection gradient $G_Z$ in the z-direction, shown in FIG. 3, and generated simultaneously with the pulse RF. The direction of the gradient $G_Z$ is subsequently inverted, the negative gradient portion of $G_Z$ canceling the dephasing of the nuclear spins which was caused by the positive portion of the gradient $G_Z$.

After excitation, a phase coding gradient $G_Y$ and a read-out gradient $G_X$ are generated. There are various possibilities for the respective curves of these two gradients. A phase coding gradient $G_Y$ is shown in FIG. 4 which remains continuously activated during the read-out phase. An alternative phase coding gradient $G_Y$ is shown in FIG. 5 which consists of individual pulses ("blips") which are activated upon the occurrence of each polarity change of the read-out gradient $G_X$. The phase coding gradient is preceded by a dephasing in gradient $G_Y$ in the negative y-direction. The read-out gradient $G_X$ is activated with a constantly changing polarity, as a result of which the nuclear spins are alternately dephased and rephased, so that a sequence of signals S arises. After a single excitation, so many signals are required that the entire Fourier k-space is scanned, i.e., the existing information is adequate for the reconstruction of a complete tomogram. For this purpose, an extremely rapid switching of the read-out gradient $G_X$ with high amplitude is required, which cannot be achieved with square-wave pulses which are usually employed in NMR imaging. A standard solution to this problem is the operation of the gradient coil which generates the gradient $G_X$ in a resonant circuit, so that the gradient $G_X$ has a sinusoidal shape.

The nuclear magnetic resonant signals S which arise are sampled in the time domain, are digitized, and the numerical values acquired in this manner are entered into a measurement matrix for each read-out pulse. The measurement matrix can be viewed as a measured data space, and in the exemplary two-dimensional embodiment as a measured data plane, in which the signal values are measured on an equidistant network of points. This measured data space is usually referred to in nuclear magnetic resonant tomography as the k-space.

Data identifying the spatial derivation of the signal contributions, which is needed for image generation, is coded in the phase factors, with the relationship between the locus space (i.e., the image) and the k-space being mathematically representable by a two-dimensional Fourier transformation. Each point in the k-space (in this case the k-plane) is therefore representable by the relationship:

$$\zeta(k_x, k_y) = \int \int \zeta(x, y) e^{i(k_x x + k_y y)} dx dy, \text{ wherein}$$

$$k_x(t) = \gamma \int_0^t G_x(t') dt', \quad k_y(t) = \gamma \int_0^t G_y(t') dt',$$

wherein $\gamma$ is the gyromagnetic ratio, and $\zeta(x,y)$ is the spin density distribution taking the relaxation times into consideration.

In FIGS. 8 and 9, the positions of the acquired measured values are schematically illustrated by points on a k-space (k-plane). FIG. 8 shows the case for the continuous gradient $G_y$ of FIG. 4, and FIG. 9 shows the case for the gradient $G_y$ shown in FIG. 5 in the form of a series of blips. For the Fourier transformation, the values must lie in an equidistant network of points, which is not the case in the examples shown in FIGS. 8 and 9. The acquired measured values therefore cannot be directly utilized, and an interpolation of the measured values onto an equidistant network of points must be undertaken.

The analog measured signal S is subjected to low-pass filtering to reduce the noise which arises in the signal acquisition. To optimize the signal-to-noise ratio, the bandwidth of the low-pass filter should exactly correspond to the signal bandwidth of the useful signal. The signal bandwidth $\Delta f_s$ is not constant given a gradient which is not constant, however, the acquisition bandwidth, and thus the noise bandwidth $\Delta f_r$ as well, by contrast, are constant given equidistant sampling of the nuclear magnetic resonance signal S at the chronological spacings $\delta t$ with $\Delta f_r = (\delta t)^{-1}$. The signal bandwidth for a sinusoidal read-out gradient is:

$$\Delta f_s(t) = \gamma \Delta x \cdot G_x(t)$$
$$= \gamma \Delta x \cdot G_{ox} \sin(\omega_G t),$$

wherein $G_{OX}$ is the amplitude of the gradient $G_X$ and $\omega_G$ is the frequency of the gradient of $G_X$.

The bandwidth of the phase coding gradient must also be taken into consideration. If the phase coding gradient $G_Y$ is maintained constant in accord with FIG. 4, the bandwidth is:

$$\Delta f_s(t) = \gamma \sqrt{(\Delta x \cdot G_{ox} \sin(\omega_g t))^2 + (\Delta y \, G_Y)^2}.$$

In the case of chronologically equidistant sampling which satisfies the sampling theorem, i.e., sampling at an interval $\gamma t = T_G/\pi N$, identical image windows in the x-direction and y-direction ($\Delta x = \Delta y$) and identical resolution in the x-direction and in the y-direction ($N_x$ and $N_y = N$), $$\Delta f_s(t) = \Delta f_r \sqrt{(\sin(\omega_G t))^2 + (2/N\pi)^2}$$

is the bandwidth of the nuclear magnetic resonant signal S. In the above expressions, $T_G$ is the period of the $G_Y$, $N_x$ is the column number of the image matrix and $N_y$ is the row number of the image matrix.

The signal bandwidth is thus not constant during sampling, due to the sampling of the nuclear magnetic resonance signal S with a non-constant rate in the k-space. Heretofore, the bandwidth $\Delta f_s$ of the bandpass filter for the analog nuclear magnetic resonance signal (time domain signal) was defined such that the sampling theorem was just satisfied for the maximum sampling rate in the k-space, i.e. the bandwidth was defined as a constant having the value $N^2 \cdot (\pi/4) \cdot T_G$ for an image matrix of $N \times N$ picture elements. The bandwidth of the low-pass filter thus becomes unnecessarily large for the largest chronological portion of the scanning (or sampling. A large bandwidth, however, also means increased noise. Maintained a low signal-to-noise ratio, however, is an especially critical problem in the echo planar imaging method.

SUMMARY OF THE INVENTION

It is an object of the present invention to improve the signal-to-noise ratio in the echo planar imaging method.

This object is achieved in accordance with the principles of the present invention in a modification of the echo planar imaging method wherein the bandwidth of the bandpass, or low-pass, filter in the signal processing circuity is adapted to follow the sampling rate in the k-space, and in particular the bandwidth is increased given increasing sampling rate. The bandwidth can thus be reduced for the majority of the scanning (or sampling), compared to a constant bandwidth. For the reasons explained above, this results in an improvement in the signal-to-noise ratio.

Given a sinusoidal curve of the read-out gradient and an $N \times N$ matrix as the raw data matrix, the bandwidth $\Delta f_s$ is optimized when it has the following chronological curve:

$$\Delta f_s(t) = 1/\delta t \sqrt{(\sin(\omega_G t))^2 + (2/N\pi)^2}.$$

In accordance with the principles of the present method, the desired curve can be achieved using a low-pass filter controlled with respect to the limit frequency. Alternatively, the desired curve can be approached by a series of low-pass filters having fixed filter characteristics, which are switched such that the desired curve of the bandwidth is approximated.

Another possibility in accordance with the principles of the present method for adapting the bandwidth to the sampling rate is to sample the nuclear magnetic resonance signal in the time domain with a higher sampling rate than is prescribed by the sampling theorem, subjecting the resulting signal to convolution with a band-limiting function, and supplying the convoluted signal to the raw data memory. Convolution of the time domain signal corresponds to bandpass filtering, because a Fourier equivalency exists between convolution and multiplication.

The band-limiting function is preferably a sinc function. The values for the band-limiting function need not be calculated on-line with a relatively high speed, but may be calculated off-line and stored in a digital memory.

Also in accordance with the principles of the present invention, the nuclear magnetic resonance signals in the time domain can be interpolated onto equidistance points in the K-space by the following steps. The nuclear magnetic resonance signal is sampled in the time domain with a higher sampling rate than prescribed by the sampling theorem. The numerical sequences thus obtained are subjected to line-by-line Fourier transformation. This transformation results in a Fourier function for each line, and this function is supplemented on both sides by setting the function equal to zero ("zeroizing"). The "zeroized" function is then back-transformed into a sampling grid which is finer than the original sampling grid these values are then subjected to a sinc interpolation, and the resulting signal is convoluted with a band-limiting function and supplied to the raw data memory.

DESCRIPTION OF THE PREFERRED EMBODIMENTS

As explained above the method disclosed herein is for the purpose of adapting the bandwidth with which the nuclear magnetic resonance signal is filtered to the sampling rate in the k-space. In practice, a low-pass filter is used for the filtering, because no disturbing, low-frequency components will thereby arise in the processed signal.

Figure 1:
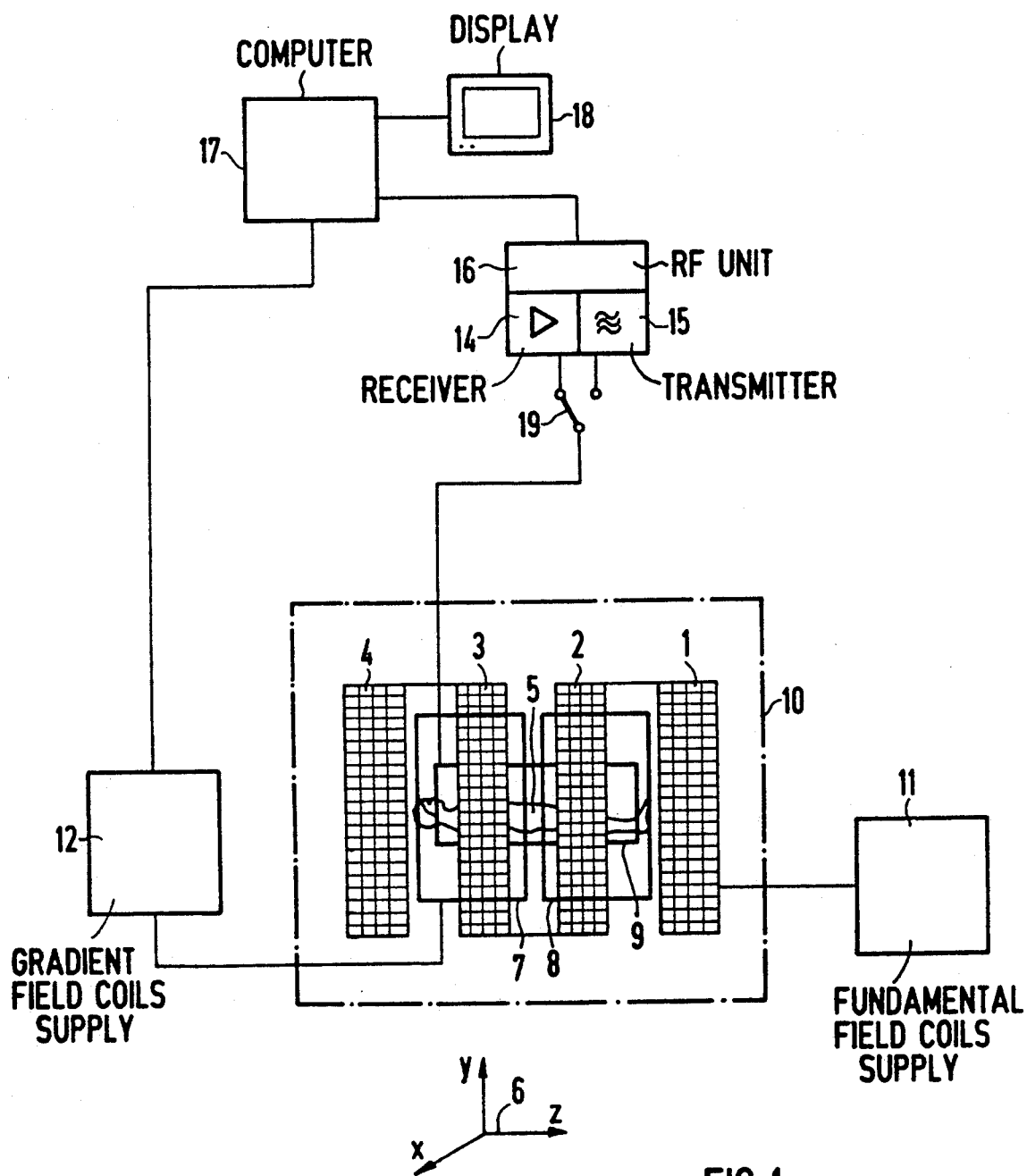
FIG. 1 is a schematic block diagram of a conventional nuclear magnetic resonance tomography apparatus which can be operated in accordance with the principles of the method disclosed herein.
Figure 2:
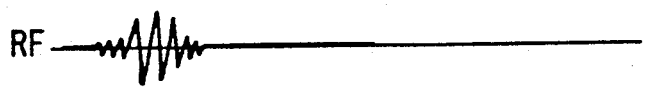
FIGS. 2-7 show signals arising in a conventional echo planar imaging sequence, with two alternatives for the gradient $G_y$.
Figure 3:
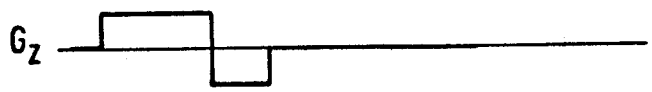
Figure 4:
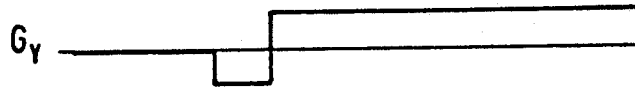
Figure 5:
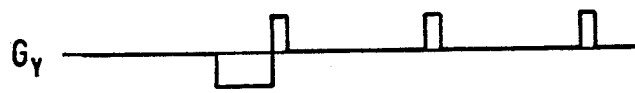
Figure 6:
Figure 7:
Figure 8:
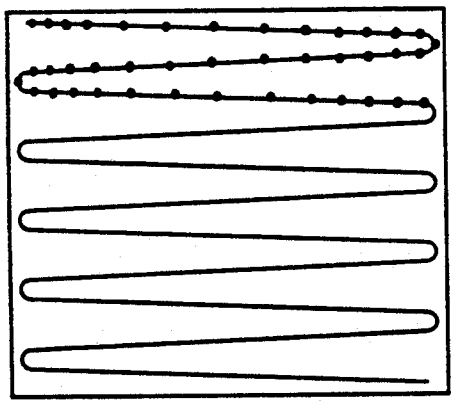
FIG. 8 is a schematic representation of the entry of data points in the k-space using the gradient $G_y$ of FIG. 4.
Figure 9:
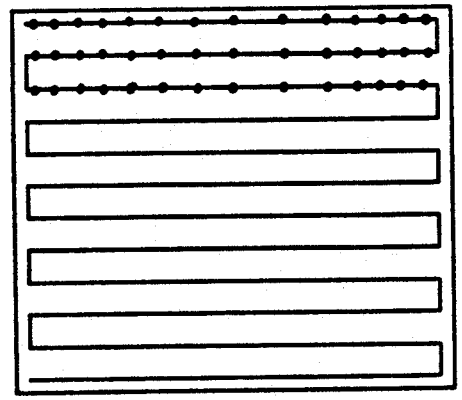
FIG. 9 is a schematic representation of the entry of data points in the k-space using the gradient $G_y$ of FIG. 5.
Figure 10:
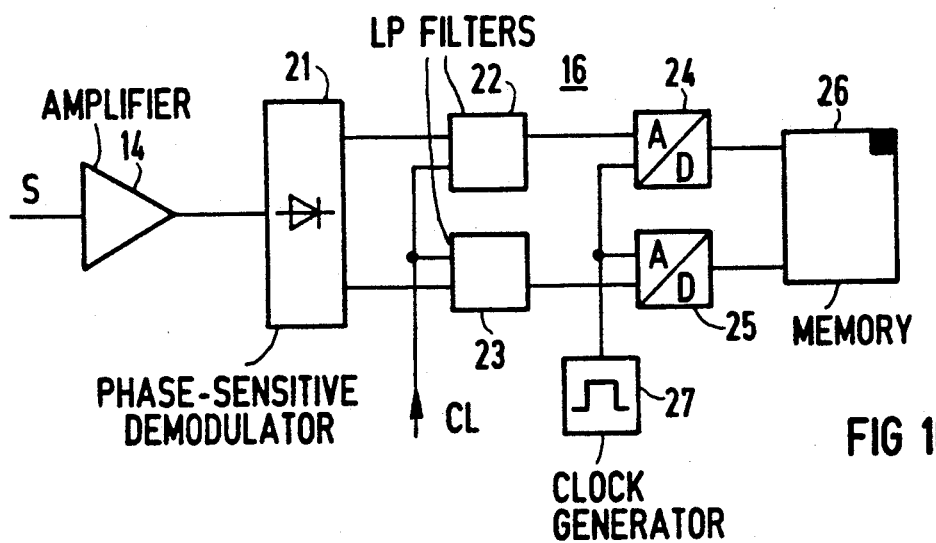
FIG. 10 is a schematic block circuit diagram of a processing circuit for conducting the method in accordance with the principles of the present invention, in a first embodiment.

A first exemplary embodiment of a circuit operating according to the method of the present invention is shown in FIG. 10. The nuclear magnetic resonance signal S is first amplified in an amplifier 14 and is supplied to a phase-sensitive demodulator 21. The demodulated signal has a real part and an imaginary part, which are processed separately. The two signal components are supplied to respective bandpass filters 22 and 23. The limit frequency of the bandpass filters 22 and 23 is controlled via a control line CL in accordance with the above-recited time-dependent bandwidth. The signal components arising at the respective outputs of the low-pass filters 22 and 23 are sampled by respective analog-to-digital converters 24 and 25. The analog to-digital converters 24 and 25 are controlled at a fixed frequency by a clock generator 27. The digital signal values which are thus obtained are written into a memory 26, and are then processed in the standard manner.

By adapting the bandwidth (i.e., the limit frequency) of the low-pass filters 24 and 25 to the time-dependent sampling rate in the k-space, signals are obtained having an optimized signal-to-noise ratio.

Figure 11:
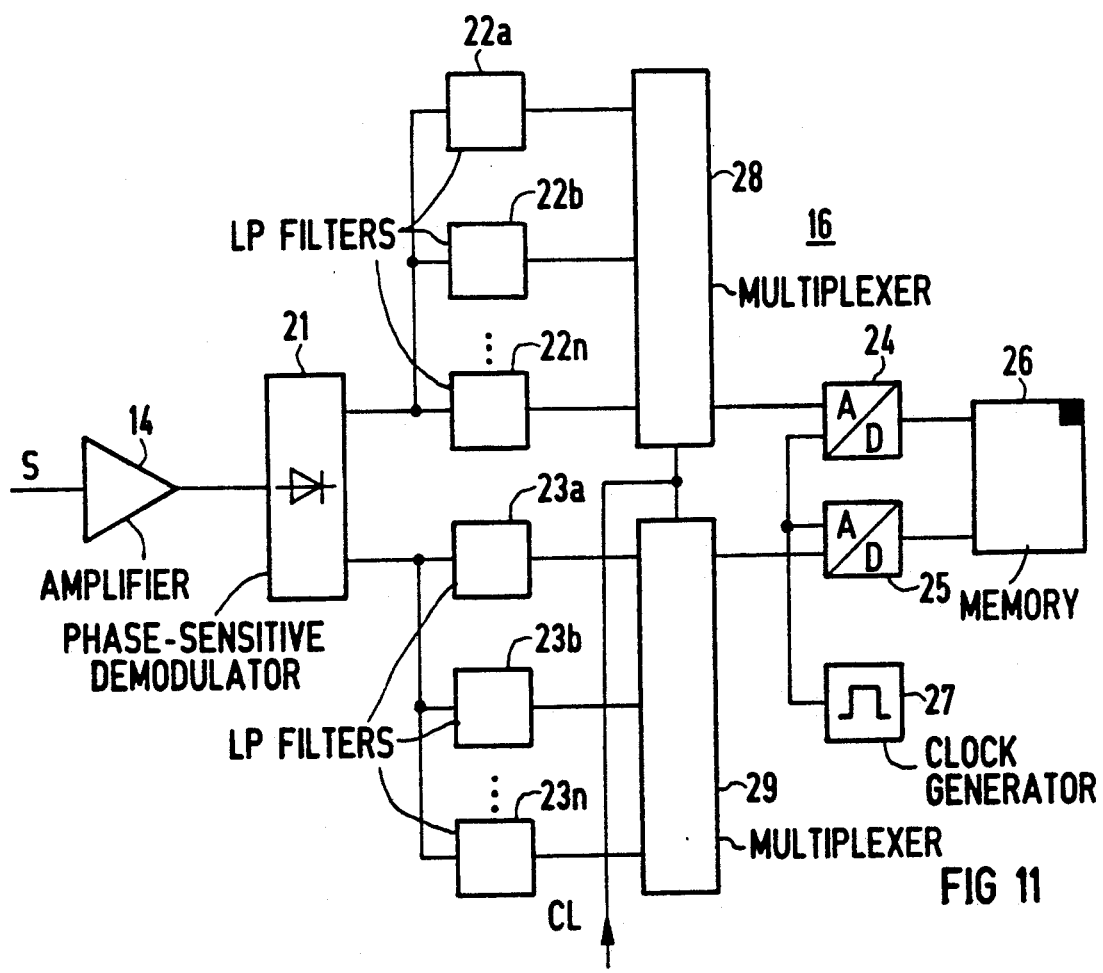
FIG. 11 is a schematic block circuit diagram of a processing circuit for conducting the method in accordance with the principles of the present invention, in a second embodiment.

A further circuit for realizing the disclosed method is shown in FIG. 11. In contrast to the circuit of FIG. 10, the circuit of FIG. 11 does not have controllable low-pass filters, but instead has a series of low-pass filters having different, fixed limit frequencies, a series being employed for each signal component at the output of the modulator 21. The outputs of low-pass filters 22a through 22n and 23a through 23n are respectively connected to multiplexers 28 and 29, which are separately provided for the real part and the imaginary part of the signal. The multiplexer 28 controls which of the outputs of filters 22a through 22n are supplied to the subsequent analog-to-digital converter 24, and the multiplexer 29 controls which of the outputs of the filters 23a through 23n is supplied to the analog-to-digital converter 25. The multiplexers 28 and 29 are both controlled by signals on a control line CL. The low-pass filters 22a through 22n and 23a through 23n are dimensioned, and the multiplexers 28 and 29 are controlled, such that the above-recited, time-dependent bandwidth is approximated by a step function.

Figure 12:
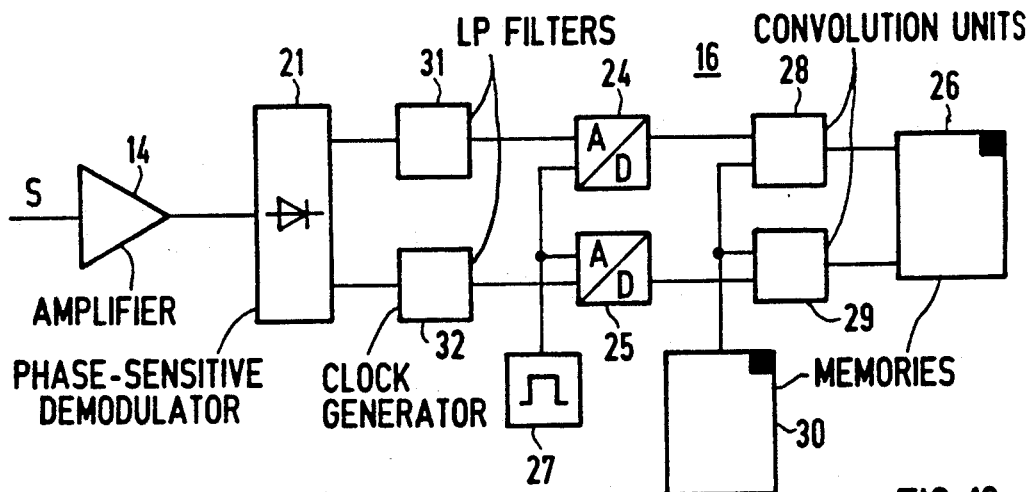
FIG. 12 is a schematic block diagram of a processing circuit for conducting the method of the present invention, in a third embodiment.

A further embodiment of a circuit for practicing the invention method is shown in FIG. 12. In the embodiment of FIG. 12, the function of the controlled low-pass filters 22 and 23 is undertaken by convolution units 28 and 29, which perform the arithmetic of a convolution function on the signals respectively supplied to the units 28 and 29. The real part and the imaginary part of the demodulated nuclear magnetic resonance signal are each filtered by respective low-pass filters 31 and 32 having a fixed limit frequency, and are sampled by respective analog-to-digital converters 22 and 23. The prerequisite for this procedure is an intentional over-scanning, or over-sampling, of the nuclear magnetic resonance signal in the time domain, i.e., the constant sampling frequency for at least a part of the sampling is larger than that required according to the sampling theorem. In the convolution units 28 and 29, which may be formed by a programmable signal processor, the real part and the imaginary part of the demodulated nuclear magnetic resonance signal is convoluted in the time domain of the band-limiting function, for example a sinc function. It is beneficial to calculate the values for this band-limiting function in advance, and to store them in a digital memory 30. As is known, there is a Fourier equivalency between convolution and multiplication. The convolution of a time signal corresponds to a band-pass filtering when the time signal is multiplied by a band-limiting function.

The time-dependent bandwidth matching for the nuclear magnetic resonance signals can thus be implemented in a relatively simple way.

As already mentioned, an over-sampling of the nuclear magnetic resonance signal in the time domain is required in the method which includes a convolution step. The interpolation required for the acquisition of values which are equidistant in the k-space can also be implemented by a Fourier operation. The nuclear magnetic resonance signal is first sampled in the time domain with a sampling grid $\delta t = 2T/N\pi$ wherein T is the duration of the period of the sinusoidal gradient, and N is the row and column number of the image matrix.

Figure 13:
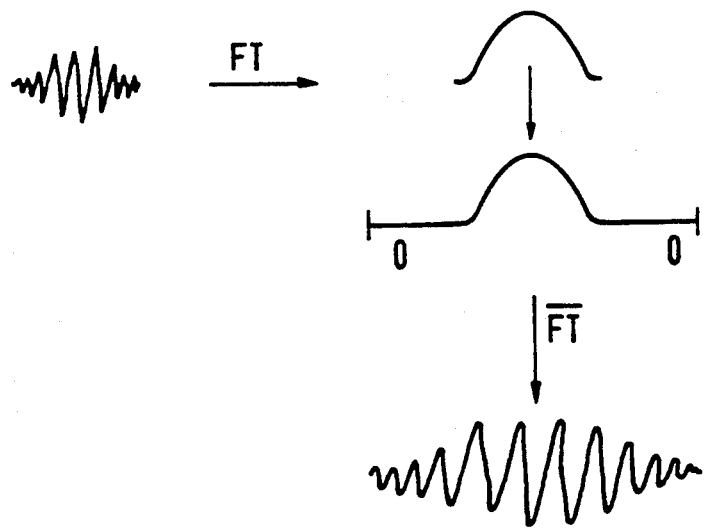
FIG. 13 is a schematic signal representation for explaining an interpolation method in accordance with the principles of the present invention.

The interpolation method is conceptionally shown in the schematic illustration of FIG. 13. The numerical sequences obtained by sampling the nuclear magnetic resonance signal in the time domain are Fourier transformed line-by-line, as indicated by the symbol FT. The function obtained as a result of this transformation is "zeroized," which as used herein means that the function is set equal to zero for portions extending on either side of the function obtained as a result of the transformation, as is also shown in FIG. 13. The zeroized function is then subjected to a back-transformation Fourier transform, symbolized by $\overline{FT}$, in a finer grid. A sinc interpolation is then undertaken. The aforementioned convolution operation can then be undertaken using the signals interpolated in this manner.

Figure 14:
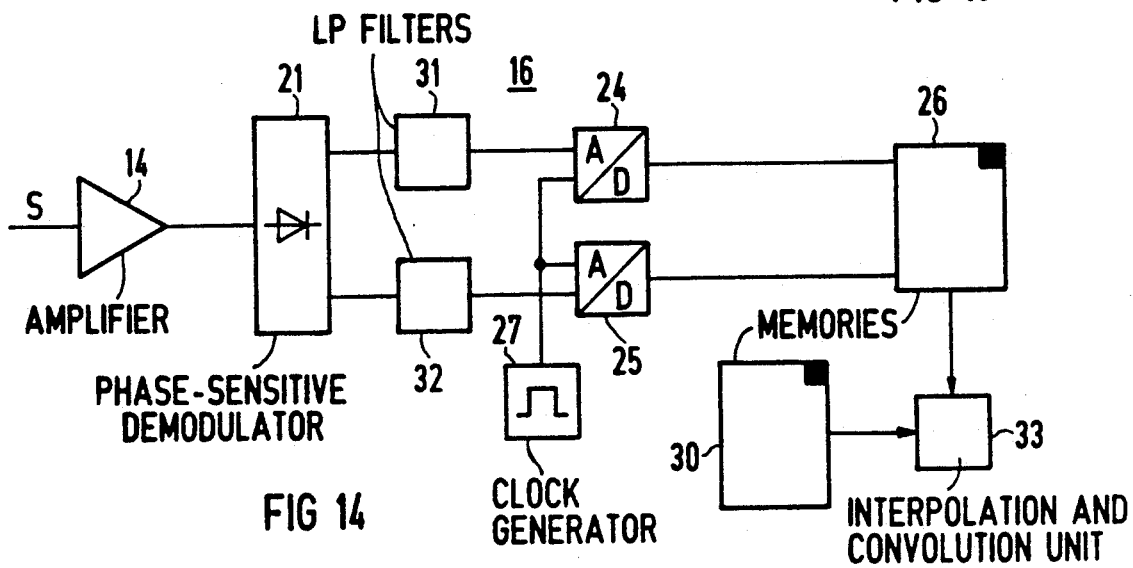
FIG. 14 is a schematic block diagram of a processing circuit for conducting the method of the present invention, in an embodiment including the interpolation technique of FIG. 13.

Convolution and interpolation can also be undertaken off-line with the values which are not convoluted and not interpolated, which are stored in the memory 26. In this case, the output values of the analog-to-digital converters 24 and 25 are directly supplied to the memory 26, as shown in FIG. 14, and are then interpolated and convoluted in an interpolation and convolution unit 33, which in practice will be the image calculator.

A mean, relative bandwidth of $2/\pi$ results due to the bandwidth adapted according to the disclosed method, which corresponds to approximately 0.64. Because noise is proportional to the square root of the bandwidth, a gain of 20% in the signal-to-noise ratio is achieved. This reduction in noise predominantly affects high frequencies, so that the visual impression of the noise improvement is greater than one might expect based solely on the 20% figure.

The method disclosed herein is not limited to the case of sinusoidal gradients which has been set forth above as an exemplary embodiment, but can be used whenever the sampling rate in the k-space is not constant.

Although modifications and changes may be suggested by those skilled in the art, it is the intention of the inventors to embody within the patent warranted hereon all changes and modifications as reasonably and properly come within the scope of their contribution to the art.

We claim as our invention

1. A method for improving the signal-to-noise ratio in a nuclear magnetic resonance tomography apparatus comprising the steps of:
    generating an RF excitation pulse for exciting nuclear spins in an examination subject;
    simultaneously generating a gradient magnetic field in a first direction thereby making said RF pulse slice-selective;
    generating a phase-coding magnetic field gradient in a second direction;
    generating a read-out magnetic field gradient pulse sequence alternating in polarity from pulse-to-pulse;
    acquiring, in the presence of said read-out gradient, nuclear magnetic resonance signal arising from said nuclear spins;
    phase-demodulating said nuclear magnetic resonance signal to obtain a real signal part and an imaginary signal part;
    subjecting said real and imaginary signal parts to respective bandpass filtration, said bandpass filtration having a bandwidth;
    digitizing said real and imaginary signal parts at a varying sampling rate;
    adapting said bandwidth to said sample rate by increasing said bandwidth as said sampling rate increases;
    entering the digitized values of said real and imaginary signal parts per read-out gradient pulse in respective rows of a raw data matrix;
    subjecting said raw data matrix to a two-dimensional Fourier transformation to obtain an image matrix; and
    producing a visual image of the selected slice of said subject from said image matrix.

2. A method as claimed in claim 1 wherein the step of generating a read-out magnetic gradient field pulse sequence is further defined by generating a read-out magnetic field gradient pulse sequence having a sinusoidal chronological curve and wherein the step of subjecting said real and imaginary signal parts to respective bandpass filtration is further defined by subjecting said real and imaginary signal parts to respective bandpass filtration in respective bandpass filters each having a bandwidth $\Delta f_s$ having the following chronological curve:

$$\Delta f_s(t) = 1/\delta t \sqrt{\sin(\omega_G t)^2 + (2/N\pi)^2}$$

wherein $\delta t$ is the chronological sampling spacing, $\omega_G$ is the radian frequency of said read-out gradient, and N is the number of columns and rows of said image matrix.

3. A method as claimed in claim 2 wherein the step of subjecting said real and imaginary signal parts to respective bandpass filtration is further defined by subjecting said real and imaginary signal parts to filtration in respective low-pass filters each having a variable limit frequency, and wherein the step of adapting said bandwidth to said sampling rate is further defined by adapting said bandwidth to said sampling rate by controlling the respective limit frequencies of said low-pass filters to achieve said chronological curve of said bandwidth.

4. A method as claimed in claim 2 wherein the step of subjecting said real and imaginary signal parts to respective bandpass filtration is further defined by supplying said real signal part to a first plurality of low-pass filters having fixed filter characteristics and supplying said imaginary signal part to a second plurality of low-pass filters having fixed filter characteristics, and wherein the step of adapting said bandwidth to said sampling rate is further defined by adapting said bandwidth to said sampling rate by switching said first and second pluralities of low-pass filters to approximate said chronological curve of said bandwidth.

5. A method as claimed in claim 1 wherein the step of digitizing said real and imaginary signal parts is further defined by digitizing said real and imaginary signal parts at a varying sampling rate which is higher than a sampling rate prescribed by the sampling theorem, and wherein the step of adapting said bandwidth to said sampling rate is further defined by convoluting said real and imaginary signal parts with a band-limiting function.

6. A method as claimed in claim 5 wherein the step of convoluting said real and imaginary signal parts with a band-limiting function is further defined by convoluting said real and imaginary signal parts with a sinc function.

7. A method as claimed in claim 5 wherein the step of phase-demodulating said nuclear magnetic resonance signal and all subsequent steps are conducted in an on-line signal processing system, and comprising the additional step of calculating values required for said band-limiting function off-line and storing said values in a digital memory.

8. A method as claimed in claim 1 wherein the step of digitizing said real and imaginary signal parts is further defined by digitizing said real and imaginary signal parts at a varying sampling rate which is greater than a sampling rate prescribed by the sampling theorem, and wherein the step of adapting said bandwidth to said sampling rate is further defined by entering numerical sequences corresponding to the sampled nuclear magnetic resonance signal in rows of said raw data memory, conducting a Fourier transformation of said rows to obtain Fourier functions, zeroizing said Fourier functions, back-transforming the zeroized Fourier functions in a sampling grid which is finer than the original sampling grid, subjecting the values in said finer sampling grid to a sinc interpolation to obtain interpolated signals, convoluting said interpolated signals with a band-limiting function to obtain convoluted signals, and writing said convoluted signals back into said raw data memory.

* * * * *